United States Patent [19]

Wetters et al.

[11] Patent Number: 5,701,600
[45] Date of Patent: Dec. 23, 1997

[54] RADIO RECEIVER AND METHOD OF CALIBRATING SAME

[75] Inventors: John Wetters, Coral Springs; John Wayne Simmons, Tamarac; Virgilio Alejandro Fernandez, Sunrise; Art Ahrens; Steve Carsello, both of Boynton Beach, all of Fla.

[73] Assignee: Motorola, Inc., Schaumburg, Ill.

[21] Appl. No.: 502,997

[22] Filed: Jul. 17, 1995

[51] Int. Cl.$^6$ .................................................. H04B 1/16
[52] U.S. Cl. .................................................. 455/208; 455/258
[58] Field of Search .................. 455/182.1, 182.2, 455/182.3, 192.1, 192.2, 192.3, 196.1, 208, 255, 258, 259, 316, 226.1; 375/344

[56] References Cited

U.S. PATENT DOCUMENTS

| | | | |
|---|---|---|---|
| 4,521,916 | 6/1985 | Wine | 455/182.1 |
| 5,140,703 | 8/1992 | Payne | 455/226.1 |
| 5,230,097 | 7/1993 | Currie et al. | 455/226.1 |
| 5,231,390 | 7/1993 | Mittel | 455/182.1 |
| 5,282,227 | 1/1994 | Crawford | 455/258 |
| 5,289,506 | 2/1994 | Kitayama et al. | 455/256 |
| 5,309,429 | 5/1994 | Fukuda | 455/257 |
| 5,321,726 | 6/1994 | Kafadar | 455/226.1 |
| 5,335,354 | 8/1994 | Koike | 455/182.2 |
| 5,408,695 | 4/1995 | Dorr | 455/226.1 |
| 5,423,085 | 6/1995 | Lim | 455/182.2 |
| 5,487,186 | 1/1996 | Scarpa | 455/258 |
| 5,493,710 | 2/1996 | Takahara et al. | 455/192.2 |
| 5,513,388 | 4/1996 | Suganuma | 455/258 |
| 5,524,282 | 6/1996 | Honma et al. | 455/226.1 |
| 5,530,723 | 6/1996 | Maplestone | 455/258 |

*Primary Examiner*—Reinhard J. Eisenzopf
*Assistant Examiner*—Marsha D. Banks-Herold
*Attorney, Agent, or Firm*—John H. Moore

[57] ABSTRACT

A method of calibrating a radio receiver (100) which has a desired IF center frequency (fo) includes generating and applying to the receiver's demodulator (126) a plurality of reference signals. The demodulated reference signals are used to generate, for the demodulator, a transfer function that is predictive of amplitude versus frequency characteristics of signals to be demodulated by the demodulator (126). The transfer function (202) is used to determine a frequency offset between a received signal's intermediate frequency and the desired frequency fo. The determined frequency offset is used to adjust the IF frequency of the received signal towards the desired frequency fo. The adjustment process preferably continues until the frequency offset is below a desired threshold. A receiver using the disclosed method is also described.

15 Claims, 5 Drawing Sheets

1

RADIO RECEIVER AND METHOD OF CALIBRATING SAME

FIELD OF THE INVENTION

This invention is generally directed to the field of radio signal receivers. It is more particularly directed to FM receivers, and to techniques for tuning such receivers so as to obtain optimum FM demodulation.

BACKGROUND OF THE INVENTION

Radio receivers such as pagers that are adapted to receive FM radio signals include an FM demodulator (discriminator). Such demodulators ordinarily include a resonant circuit or other tunable element to properly set the center frequency of the demodulator.

With conventional FM receivers, factory tuning of the demodulator's center frequency is required. This typically involves injecting an RF signal at the receiver's antenna, and then manually, or by computer, adjusting the demodulator's tunable element until it is tuned to the desired center frequency.

Although the conventional tuning technique described above achieves proper tuning, it is costly in terms of test time and equipment, and it can typically be accomplished only within a qualified test facility.

Another conventional technique that can be used for tuning the tunable element of a demodulator in a transceiver (transmitter plus receiver) involves leaving the demodulator's tunable element untuned, and coupling a portion of the transmitter's output signal into the receiver. The transmitter's output signal is assumed to be at a desired center frequency, and is used as a reference to adjust the receiver's intermediate frequency when receiving a signal from a remote transmitting station. Such a technique is described in U.S. Pat. No. 5,309,429 issued May 3, 1994 to Fukuda. One problem with the approach described in Fukuda is the costly utilization of a transmitter for generating the center frequency reference. In addition, using a singular reference point (the frequency of the transmitter's output signal) for adjusting the center frequency of the receiver slows down the time to converge to the desired center frequency, which results in a reduction of the transceiver's battery life.

It would clearly be desirable if such conventional tuning techniques could be eliminated, and thus avoid their associated costs and shortcomings.

DESCRIPTION OF THE PREFERRED EMBODIMENT

Figure 1:
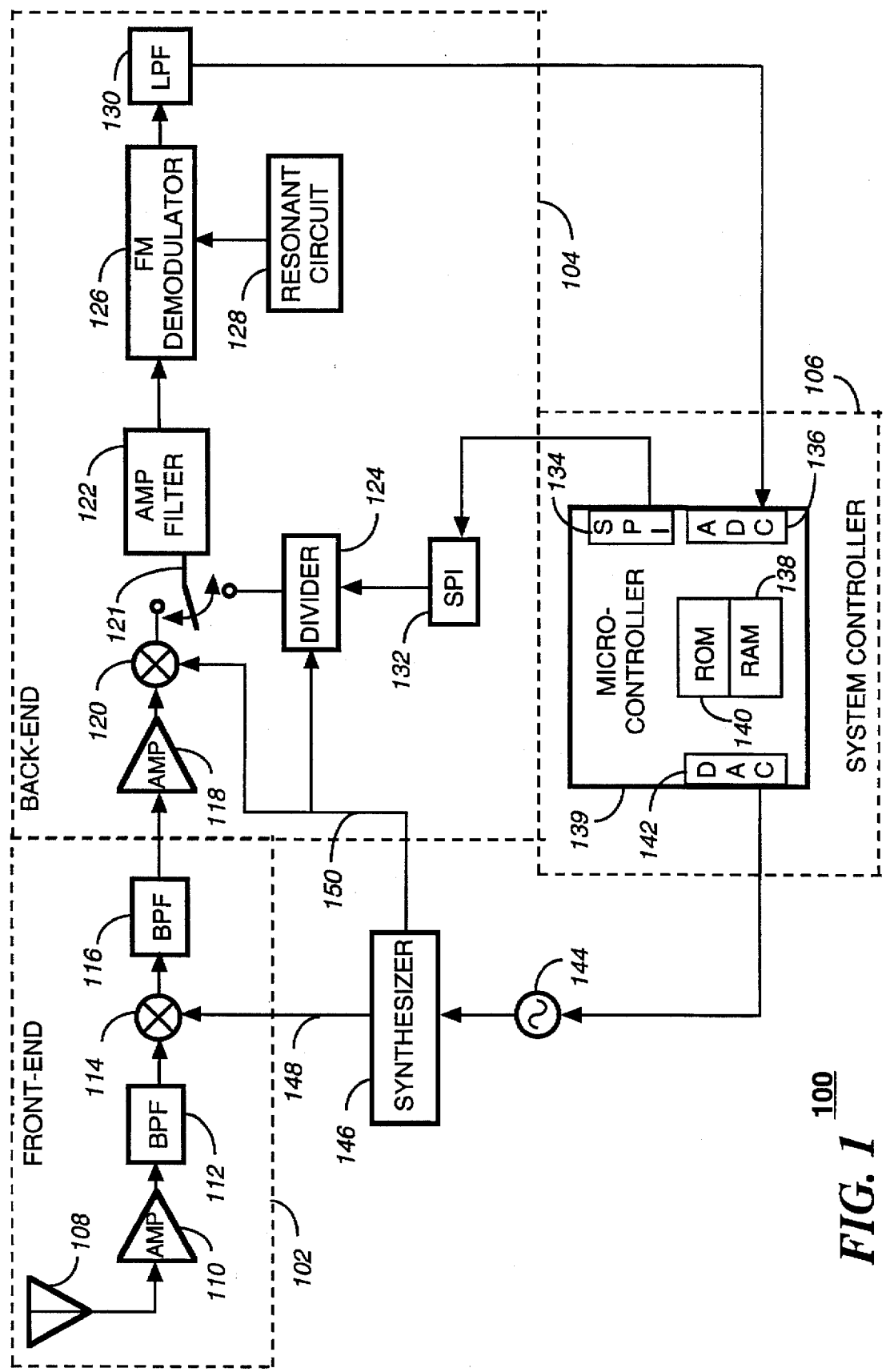
FIG. 1 is an electrical block diagram of a self-calibrating selective call receiver in accordance with a preferred embodiment of the present invention.

Referring to FIG. 1, an electrical block diagram of a self-calibrating selective call receiver 100 in accordance with the present invention comprises a front-end 102, a back-end 104, and a system controller 106. The selective call receiver 100 is used as a radio receiver for receiving frequency-shift-keyed (FSK) signals from a remote transmitting station (not shown). The illustrated self-calibrating selective call receiver 100 receives two and four level FSK signals preferably transmitted at a baud rate of 1600 or 3200 symbols-per-second (sps), depending on traffic requirements and system transmission gain. The two-level FSK signals typically operate at frequency deviations of ±4.8 KHz centered around a carrier frequency $f_c$ (e.g., 900 MHz), and the four level FSK signals typically operate at frequency deviations of ±1.6 KHz and ±4.8 KHz also centered around $f_c$. It will be appreciated that, alternatively, other frequency deviations can be used such as, for example, ±3.2 KHz. It will further be appreciated that, alternatively, higher multiples of FSK signals such as eight and sixteen level FSK signals can be utilized.

The front-end 102 shown in FIG. 1 comprises an antenna 108, an amplifier 110, a band-pass filter (pre-selector) 112, a first mixer 114, and a first intermediate frequency ($IF_1$) band-pass filter (BPF) 116. In the illustrated example where $f_c$ is 900 MHz, $IF_1$ is typically 45 MHz.

The antenna 108 is a conventional receiver antenna for receiving frequency modulated (FM) signals. The amplifier 110 is conventional and is coupled to the antenna 108 for amplifying signals received by the antenna 108. The band-pass filter 112 receives the output of the amplifier 110, and removes signals at frequencies ($f_c-2IF_1$) that tend to develop an image at the output of the first mixer 114. The band-pass filter 112 has a pre-defined pass-band (e.g., 20 MHz) centered at $f_c$ to exclude the image frequency of the first mixer 114.

The first mixer 114 receives the output of the band-pass filter 112 and an oscillator injection signal on lead 148 from a conventional dual loop synthesizer 146 that receives an oscillator signal 144. The synthesizer 146 and the oscillator 144 together constitute an oscillator circuit for generating oscillator injection signals on leads 148 and 150. The oscillator injection signal on lead 148 is a low side injection signal comprising the center frequency minus the first IF frequency (i.e., $f_c-IF_1$). Alternatively, the first mixer 114 can utilize high-side injection (i.e., $f_c+IF_1$). In either case, the first mixer's 114 image frequency is $IF_1$.

The output from the first mixer 114 is coupled to the band-pass filter 116 which is conventionally designed to remove signals at frequencies that tend to develop images as a result of further mixing in the back-end 104.

At this point it should be understood that the selective call receiver 100 is capable of operating in two modes: a receive mode and a calibrate mode. In the receive mode, signals received by the antenna 108 are processed by the front-end 102 as described above, and then supplied to the back-end 104 where they are further processed in a conventional manner. The operation of the back-end 104 will now be described in terms of the receive mode. The calibrate mode will then be described.

The back-end 104 comprises an amplifier 118, a second mixer 120, a second IF amplifier-filter 122, an FM demodulator (or FM discriminator) 126, and a low-pass filter (LPF) 130.

The amplifier 118 amplifies the output of the band-pass filter 116 and couples the amplified signal to the second mixer 120. The latter device also receives, via lead 150 from the dual loop synthesizer 146, an oscillator injection signal whose frequency is equal to $IF_1+f_o$, where $f_o$ is the desired IF center frequency of the back-end 104. In this example, fo is equal to 455 KHz. With these inputs, the second mixer 120 generates an output signal whose desired frequency is equal to $f_o$. Because of component tolerances and other factors mentioned earlier, the frequencies of the signals output from the mixer 120 will normally not be exactly at $f_o$ without some adjustment. As will be described, the present invention provides (by adjustments made in the calibrate mode) an IF frequency which is at or very near $f_o$ without adjustment of any components.

FM signals received by the antenna 108 include information or data that is of interest to the selective call receiver 100. Such data that is converted to the intermediate frequency at the output of the mixer 120 is referred to herein as IF data.

IF data output from the mixer 120 is coupled to an amplifier-filter 122 via a conventional radio frequency (RF) switch 121. The amplifier-filter 122 defines the receiver's overall bandpass of the subchannel assigned to the receiver, and also conditions the amplitude of the IF data.

The amplifier-filter 122 includes conventional amplifiers and bandpass filters which process the IF data to essentially remove adjacent channel interference from other subchannel frequencies. The amplifier-filter 122 also includes a conventional limiter which removes amplitude variations in the IF data.

The amplifier-filter 122 can also receive a signal from a programmable frequency divider 124 that is described later in connection with the calibrate mode. The frequency divider 124 is programmed by the system controller 106 via a synchronous peripheral interface (SPI) 132.

The position of the RF switch 121 is preferably programmed by setting a register (not shown) in the back-end 104 device. Programming of the register is performed by the system controller 106 via the SPI 132 as will be described below.

The conditioned signal output from the amplifier-filter 122 is coupled to the input of the FM demodulator 126 which demodulates the IF data to baseband thereby, providing demodulated data. The FM demodulator 126 is also coupled to a resonant circuit 128 which tunes the demodulator to its center frequency $f_o$. In conventional usage, the resonant circuit 128 is tunable, and is tuned, either manually or automatically, in a controlled factory environment. In contrast, the selective call receiver 100 is designed so that the resonant circuit 128 need not be tunable. It may include conventional tolerances to its desired resonant frequency. Because of the precision with which the second intermediate frequency is calibrated during calibrate mode, the conventional tolerances associated with the resonant circuit are acceptable.

Returning to the demodulator 126, the demodulated data which it generates is further processed by the LPF 130 which removes baseband noise outside of the desired baseband operating frequency. The resulting signal is supplied to the system controller 106.

The system controller 106 is used, in the calibrate mode, for self-calibration of the back-end 104, and for processing the demodulated data originating from a received FM signal. The demodulated data received by the system controller 106 in the receive mode is preferably similar to Motorola's well-known FLEX™ digital selective call signaling protocol as described more fully in U.S. Pat. No. 5,168,493 issued Dec. 1, 1992 to Nelson et al., and assigned to the assignee of the present invention and which is hereby incorporated by reference. It will be appreciated that, alternatively, other signaling protocols, modulation schemes, and transmission rates can be utilized as well.

As shown, the system controller 106 may be in the form of a micro-controller 139 that comprises an analog to digital converter (ADC) 136, a digital to analog converter (DAC) 142, a SPI 134, a read-only memory (ROM) 140, and a random access memory (RAM) 138.

It will be appreciated that the RAM 210 and the ROM 214, singly or in combination, can be integrated as an integral portion of the micro-controller 139. Likewise, ADC 136, the DAC 142 and the SPI 134, singly or in combination, can also be integrated as an integral portion of the micro-controller 139. Preferably, the micro-controller 139 is similar to the MC68HC11 manufactured by Motorola, Inc. It will be appreciated that other similar processors can be utilized for the micro-controller 139, and that additional processors of the same or alternate type can be added as required to handle the processing requirements of the selective call receiver 100.

The demodulated data that passes through the LPF 130 is applied to the ADC 136 where it is sampled to produce digitized demodulated data to be decoded conventionally by the micro-controller 139. The SPI 134 of the system controller 106 is used for communicating with the SPI 132 of the back-end 104 for programming the frequency divider 124, and RF switch 121 during the calibration mode. A more complete description of the operation of the SPI's such as SPI 132 and SPI 134 may be found in a textbook by Motorola Inc, entitled "MC68HC11 Reference Manual", published in 1991 by Motorola Inc, of Schaumburg, Ill. on pages 8-1 to 8-15, the text of which is incorporated herein by reference.

The DAC 142 is used by the micro-controller 139 for controlling the oscillator 144 coupled to the dual loop synthesizer 146 for generating the first (at lead 148) and second (at lead 150) oscillator injection signals used by the front-end 102 and back-end 104. The frequency of the oscillator 144 is controlled by a conventional varactor circuit (not shown) used by the system controller 106 for performing automatic frequency control (AFC) of the front-end 102 and the back-end 104.

The ROM 140 of the micro-controller 139 is programmed with firmware elements for processing demodulated data and for calibrating the front-end 102 and the back-end 104.

The RAM 138 is used by the micro-controller as a scratch pad memory for processing demodulated data and calibration data. It will be appreciated that, alternatively, the micro-controller 139, the ROM 140, and the RAM 138 can be replaced with a programmed application specific integrated circuit (ASIC) device employing conventional digital and analog design techniques, well known in the art, for implementing the same functions of the firmware elements used by the micro-controller 139.

As described above, the SPI 134 of the system controller 106 is used for programming the frequency divider 124 for operations in the calibrate mode. The frequency divider 124 receives the oscillator injection signal from the dual loop synthesizer 146 on lead 150 and, under control of the system controller 106 via the SPI 132, divides the oscillator injection signal by a plurality of divisors to generate a plurality of reference signals which are within the operating frequency range of the FM demodulator 126. These reference signals are applied to the amplifier-filter 122 to generate conditioned reference signals which are then demodulated by the FM demodulator 126 resulting in demodulated reference signals. The demodulated reference signals are used by the system controller 106 for calibrating the receiver in a manner described below.

Figure 2:
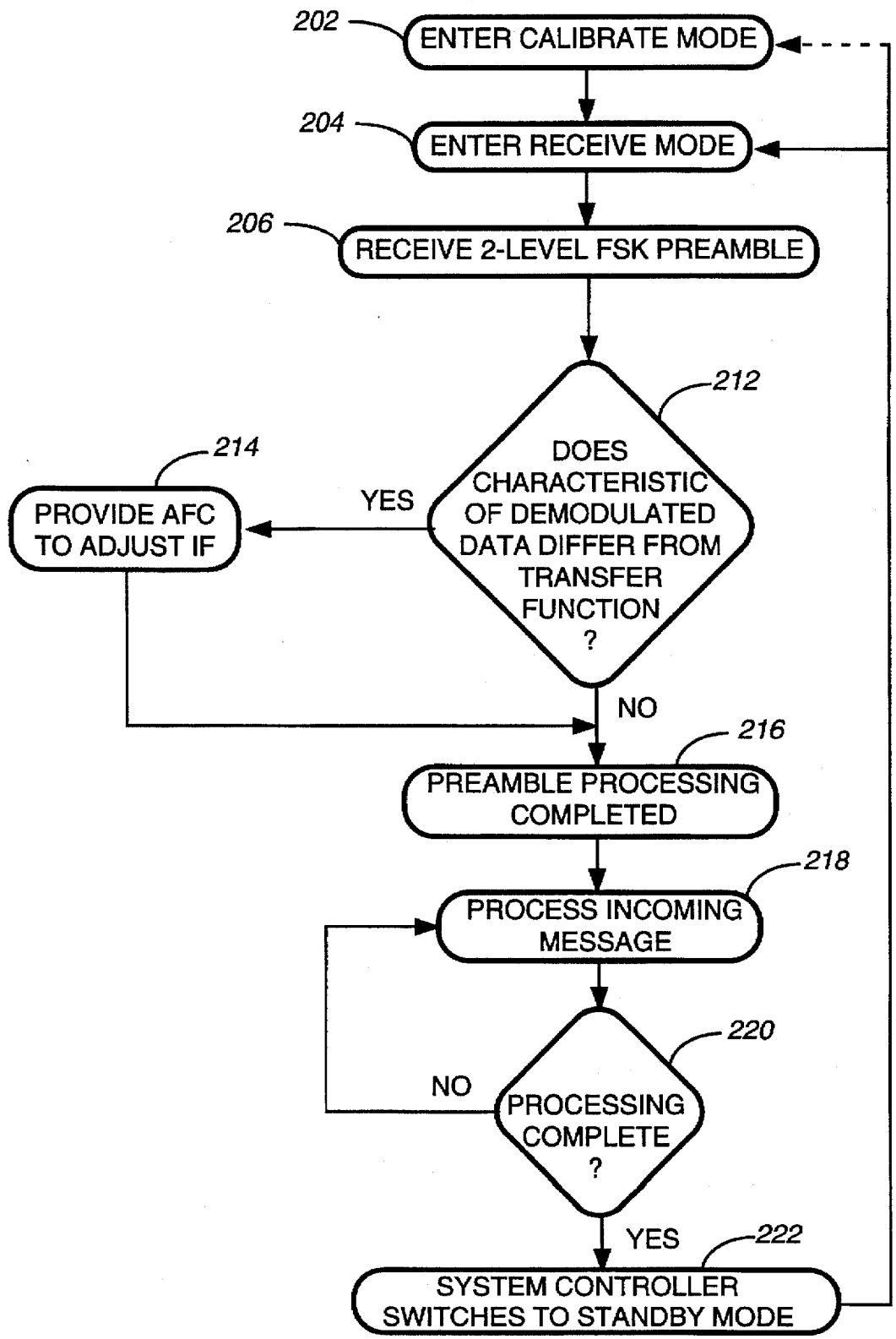
FIGS. 2 and 3 are flow charts depicting self-calibration and receive mode operations utilized by the system controller of FIG. 1.

FIG. 2 is a flow chart 200 depicting an overview of the calibrate and receive mode operations programmed into the system controller 106. The flow chart begins with step 202 where the system controller 106 enters the calibrate mode. In the calibrate mode (described in more detail in connection with FIG. 3), the system controller 106 is programmed to determine, for the FM demodulator 126, a transfer function that is predictive of amplitude versus frequency characteristics of signals to be demodulated by the FM demodulator 126. Once the FM demodulator 126 transfer function has been determined, the system controller 106 proceeds to step 204 where it enters the receive mode operation. In the receive mode, the system controller 106 initially receives a transmitted signal from a remote transmission station, in the form of two-level FSK signals (step 206), comprising a preamble preferably corresponding to a comma pattern (i.e., alternating one's and zero's pattern). The preamble is demodulated to baseband by the combination of the front-end 102 and the back-end 104. The resulting baseband signal is demodulated data which appears as a square wave at the output of the LPF 130.

In step 212, the micro-controller 139 samples the demodulated data by way of the ADC 136, and compares a characteristic of the demodulated data to a corresponding characteristic predicted by the transfer function so as to indirectly determine whether the intermediate frequency of the demodulated data differs from the desired frequency $f_o$. The details of such comparison are discussed below. Suffice it to say at this point that if a sufficient difference is determined during the execution of step 212, the program proceeds to step 214. In this step, the micro-controller 139 performs an AFC adjustment so as to bring the intermediate frequency of the demodulated data closer to the desired IF center frequency $f_o$.

When the execution of step 212 results in no significant difference being found, the program proceeds to step 216 where the remaining portion of the preamble is processed. Once the preamble processing is complete, the micro-controller 139 proceeds to step 218 where it initiates processing of the incoming message, and continues processing of the message until the micro-controller determines in step 220 that message processing has been completed. Once message processing is complete, the selective call receiver 100 switches to standby mode in step 222, thereby providing a battery saving function. The system controller 106 is programmed to remain in standby mode for a predetermined time limit.

Upon expiration of the time limit, the micro-controller 139 power's up in one of two modes. Depending on the programming of the micro-controller 139, it can either enter the calibrate mode in step 202 prior to entering the receive mode, or enter the receive mode in step 204 directly.

Factors which determine the programming of the micro-controller 139 during power up include aging and temperature effects on components in the front-end 102 and back-end 104. These effects can substantially contribute to change in the IF center frequency $f_o$. These effects, however, occur slowly over time, and therefore do not require the need for re-calibration of the front-end 102 and the back-end 104 every time the micro-controller 139 processes an incoming message. For this reason, the calibration mode in step 202 is preferably entered only periodically, e.g., every 10 minutes (as shown by way of example with the dashed line).

Figure 3:
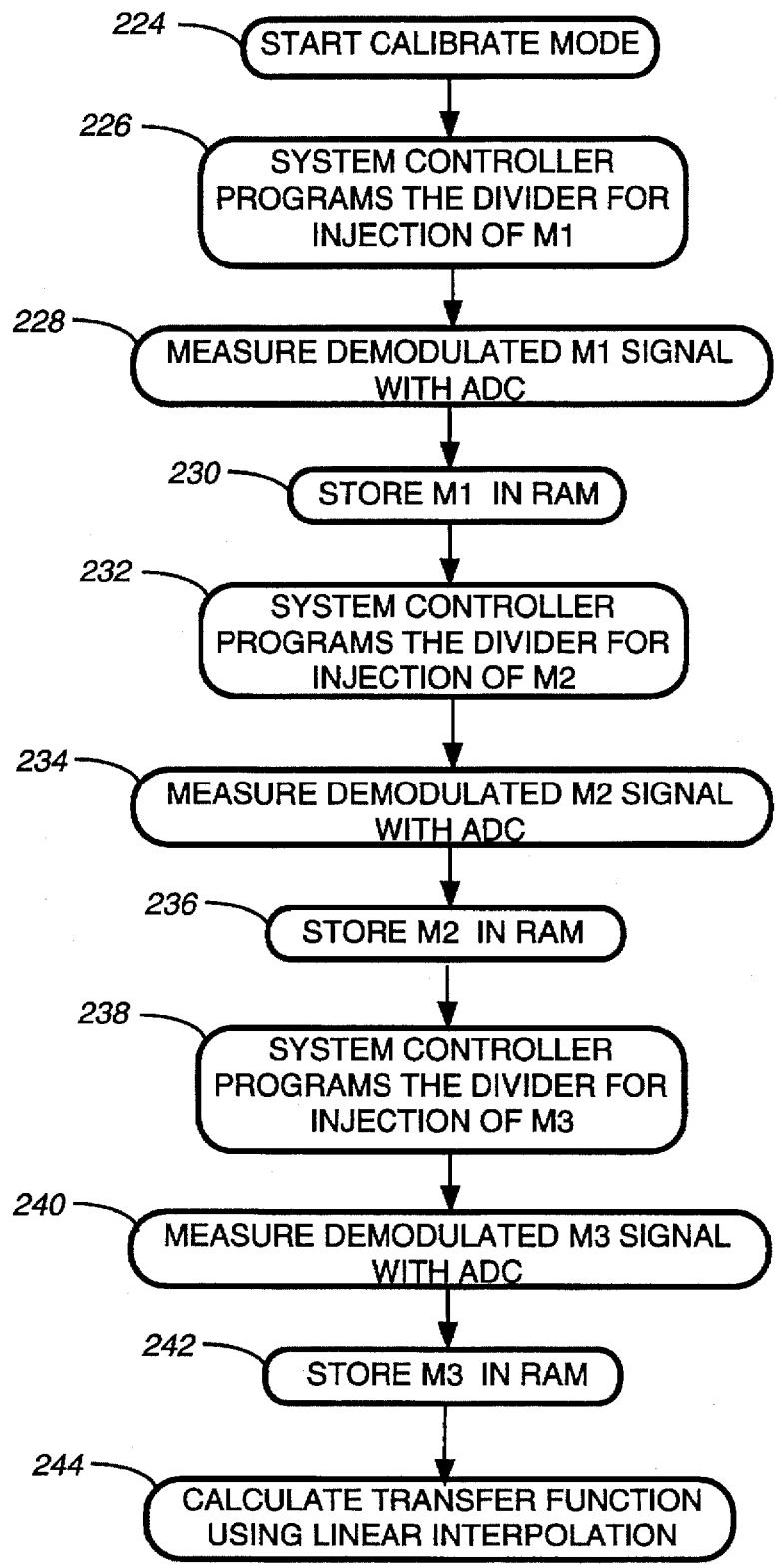

FIG. 3 is a flow chart 202 depicting detailed steps of the calibrate mode programmed into the system controller 106. The flow chart begins with step 224 where the system controller 106 begins the calibrate mode. The system controller 106 proceeds to step 226 where the micro-controller 139 programs the frequency divider 124 by a first divisor which divides the frequency of the oscillator injection signal on lead 150, thus generating a first reference signal referred to as marker 1 ($M_1$). The frequency of $M_1$ is chosen such that it is substantially equal to the desired IF center frequency $f_o$. During calibration mode the RF switch 121 is programmed to couple the frequency divider 124 and the amplifier-filter 122. The marker M1 is demodulated by the FM demodulator 126 which generates a demodulated reference signal corresponding to $M_1$ at the output of the LPF 130. The system controller 106 samples the demodulated $M_1$ signal with the ADC 136 in step 228, and records it in the RAM 138 in step 230.

In step 232, the system controller 106 re-programs the frequency divider 124 by a second divisor to generate a second reference signal referred to as marker 2 ($M_2$). The frequency of $M_2$ is chosen such that it is at a frequency higher than fo by a selected amount (e.g., +5 KHz). The FM demodulator 126 demodulates the marker $M_2$ and generates a demodulated reference signal corresponding to $M_2$ at the output of the LPF 130. The system controller 106 samples the demodulated $M_2$ signal in step 234, and records it in the RAM 138 in step 236.

Steps 238, 240, and 242 perform the same functions described above for a third reference signal referred to as marker 3 ($M_3$). The frequency of $M_3$ is chosen such that it is at a frequency lower than fo by the same selected amount (e.g., −5 KHz).

Note that the second and third reference signals preferably have frequency deviations from fo which are at least as large as the largest frequency deviations (e.g., ±4.8 KHz) of the FSK signals likely to be received during the receive mode. In step 244, the three markers ($M_1$, $M_2$, and $M_3$) are used to determine the FM demodulator's 126 transfer function as a piece-wise linear transfer function with the three demodulated reference signals being coordinates of the piece-wise linear transfer function. The piece-wise linear transfer function is used to predict amplitude versus frequency characteristics of signals to be demodulated by the FM demodulator 126 when in receive mode.

Figure 4:
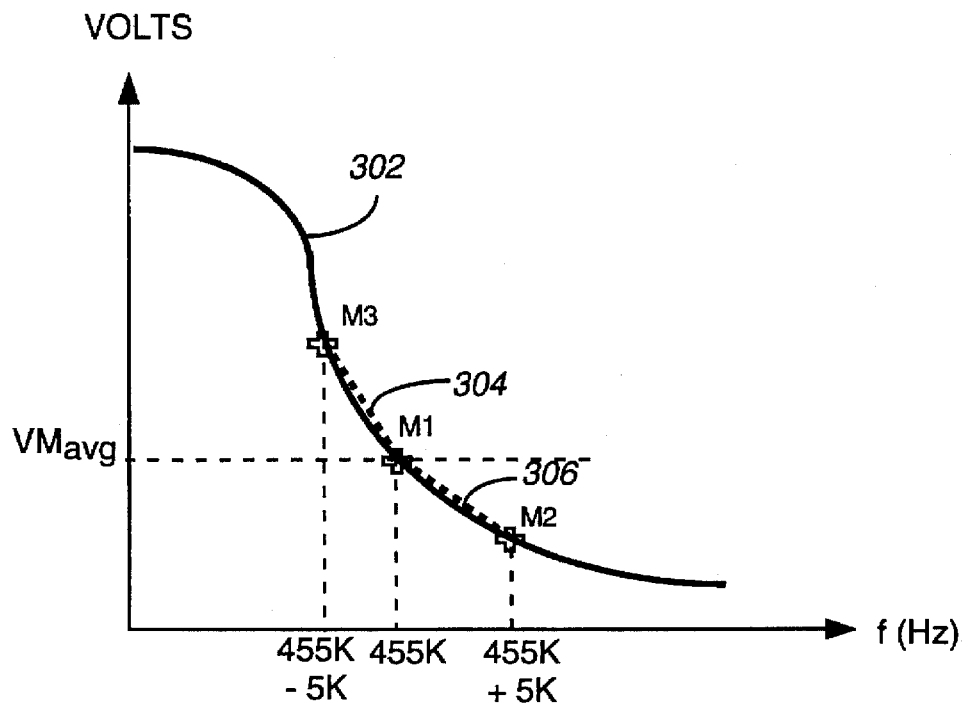
FIG. 4 shows an interpolated, piece-wise linear transfer function for the FM demodulator of FIG. 1.

FIG. 4 is a diagram of the calculated piece-wise linear transfer function superimposed on an actual transfer function 302 of the FM demodulator 126 of FIG. 1. The piece-wise linear transfer function is calculated using the three marker frequencies $M_1$, $M_2$, and $M_3$. The linear portions are indicated by a straight dashed line 304 between $M_3$ and $M_1$, and a straight dashed line 306 between $M_2$ and $M_1$. The system controller 106 stores the coordinates of $M_1$, $M_2$, and $M_3$ in the RAM 138, and uses these coordinates for linear interpolation, as will be described below. As indicated, $M_1$ is at the center frequency fo (shown as 455 KHz by way of example). $VM_{avg}$ is the corresponding voltage at $M_1$ (fo). This voltage is used for calibrating the selective call receiver 100, as described below. The frequency at $M_3$ is at a selected amount below fo, and the frequency at $M_2$ is higher than fo by substantially the same selected amount (shown as 455 KHz−5 KHz and 455 KHz+5 KHz, respectively).

The distance between $M_3$ and $M_2$ represents the operating frequency range of signals to be received by the selective call receiver 100. That is, in order to predict sample points of signals to be demodulated by the FM demodulator 126, the received samples should fall within the frequency range of $M_3$ and $M_2$. The system controller 106 uses the estimated piece-wise linear transfer function to determine if a frequency offset exists between the intermediate frequency of a received signal and fo. When a frequency offset is detected, the system controller 106 performs AFC adjustments to counter the offset, as will be described below.

Figure 5:
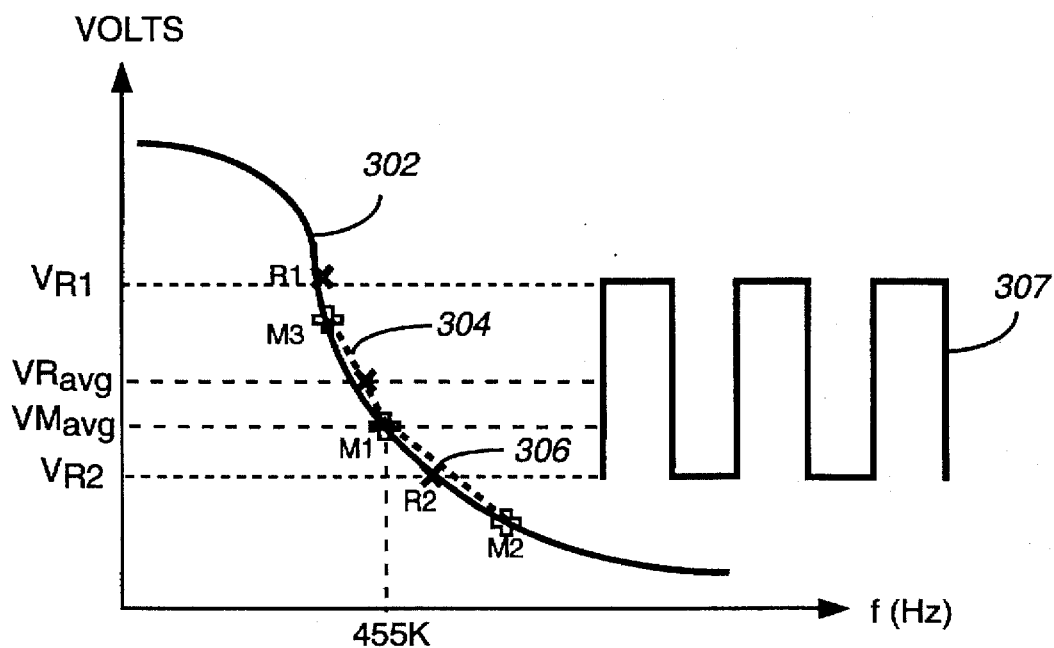
FIG. 5 is a diagram of a received signal compared to the transfer function of FIG. 4.

FIG. 5 is a diagram of a received signal 307 compared to the transfer function of FIG. 4. The received signal 307 may be, for example, a demodulated preamble of alternating one's and zero's which is represented by two DC voltage levels ($R_1$ and $R_2$). As described above, the frequency deviations of $R_1$ and $R_2$ must be well within the operating frequency range of the demodulator and/or inclusive within the $M_2$ and $M_3$ frequencies. $R_1$ and $R_2$ represent samples which fall on the actual transfer function 302 as shown. The average amplitude ($VR_{avg}$) of the preamble can be calculated by the formula ($V_{R1}+V_{R2}$)/2, where $V_{R1}$ and $V_{R2}$ are the DC voltages corresponding to $R_1$ and $R_2$, respectively. $VR_{avg}$, as shown, is inversely proportional to the actual intermediate frequency of the received signal. That is, a rise in the intermediate frequency of the received signal results in a decrease in the $VR_{avg}$ voltage, and vice-versa.

$VR_{avg}$ could fall on the dashed line 304 between $M_3$ and $M_1$, or the dashed line 306 between $M_2$ and $M_1$. In this example, $VR_{avg}$ falls on the dashed line 304 between $M_3$ and $M_1$. The system controller 106 is programmed to determine any difference between the average amplitude ($VR_{avg}$) of the demodulated data and the amplitude ($VM_{avg}$) predicted by the transfer function for signals at the desired center frequency fo.

Figure 6:
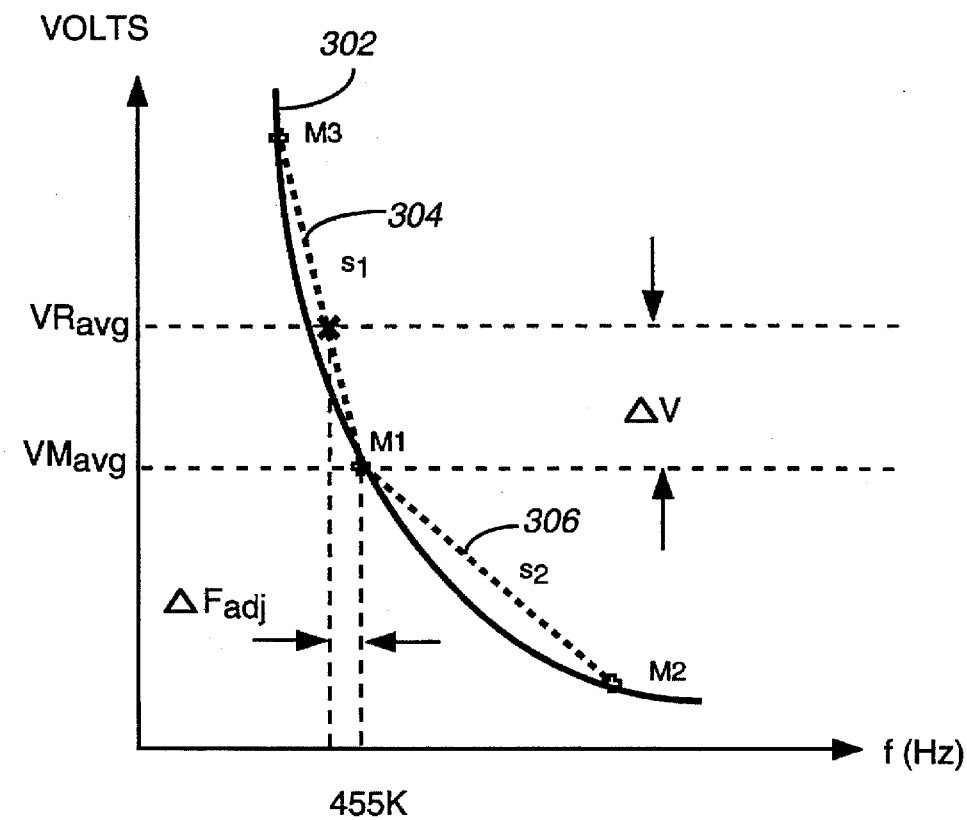
FIG. 6 is an expanded view of FIG. 5, showing the details for calculating a voltage and frequency offset.

FIG. 6 is an expanded view of FIG. 5 illustrating the details for calculating a voltage and frequency offset of the received signal. The dashed line 304 between $M_3$ and $M_1$ is shown with a slope of $s_1$ and the dashed line 306 between $M_2$ and $M_1$ is shown with a slope of $s_2$. The slopes $s_1$ and $s_2$ are determined from the coordinates of $M_3$ and $M_1$, and $M_2$ and $M_1$ utilizing the formulas $s_1=(VM_{avg}-V_{R1})/5$ KHz and $s_2=(V_{R2}-VM_{avg})/5$ KHz. As shown, $VR_{avg}$ falls on the line 304 with slope $s_1$. The difference between $VR_{avg}$ and $VM_{avg}$ results in an offset voltage $\Delta V$. From the offset voltage $\Delta V$ an adjustment frequency $\Delta F_{adj}$ can be determined. The equation $s_1=(\Delta V/\Delta F_{adj})$ is used to determine $\Delta F_{adj}$ which is indicative of the magnitude of $\Delta V$.

Figure 7:
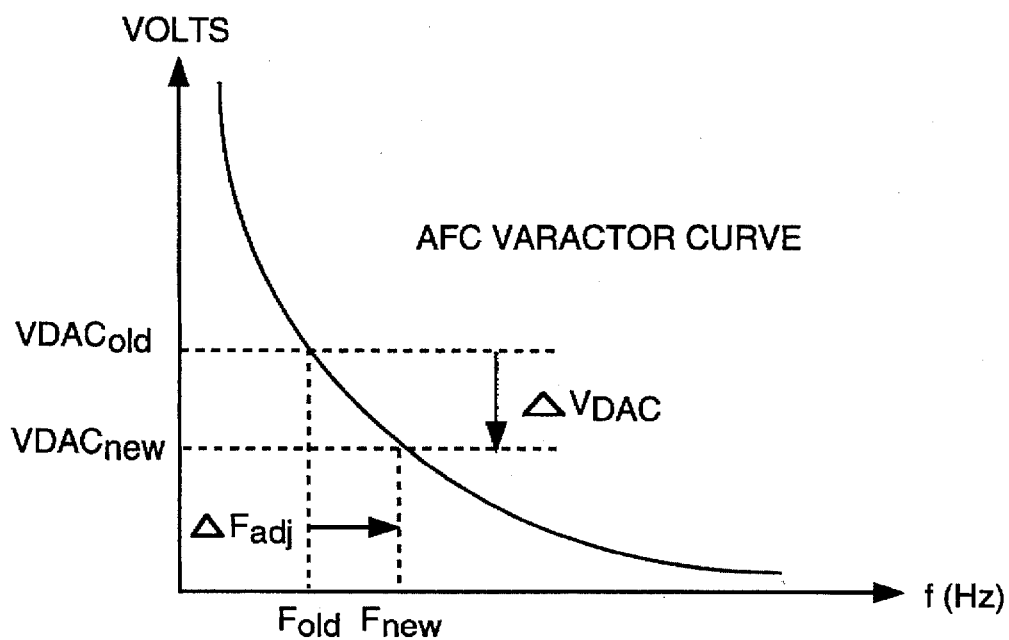
FIG. 7 is a diagram depicting the relationship between voltage and frequency of a conventional varactor used for tuning the center frequency of the FM demodulator of FIG. 1.

FIG. 7 is a diagram depicting the relationship between voltage and frequency of a conventional varactor used for tuning the center IF frequency of the FM demodulator of FIG. 1. $VDAC_{old}$ represents the old voltage reference programmed into the DAC 142 (of FIG. 1). This voltage corresponds to a reference frequency $F_{old}$ of the oscillator 144. In the example of FIG. 6, the operating IF frequency of the received signal is lower than the desired center frequency $f_o$ by the amount $\Delta F_{adj}$. Adjusting the oscillator 144 by $\Delta F_{adj}$ corresponds to a rise in frequency in the oscillator 144 from $F_{old}$ to $F_{new}$. Consequently, $F_{new}$ results in a decrease in DAC voltage of $\Delta V_{DAC}$ from $VDAC_{old}$ to $VDAC_{new}$. The decrease in DAC voltage $\Delta V_{DAC}$ corresponds to an error signal indicative of the magnitude of $\Delta V$. The error signal is used by the system controller 106 to perform AFC adjustments on the intermediate frequency of the demodulated data so as to bring it closer to the frequency $f_o$. To determine $VDAC_{new}$, the micro-controller 139 uses a conventional lookup table, programmed into the ROM 140, of voltage versus frequency samples of the varactor.

Once $VDAC_{new}$ has been programmed into the DAC 142, the system controller 106 repeats the steps defined in the flow charts of FIGS. 2 and 3 until the offset $\Delta V$ (of FIG. 6) between the average amplitude of the received signal $VR_{avg}$ and the desired center frequency voltage $VM_{avg}$ is within a desired threshold error (e.g. 20 mV). Alternatively, the frequency offset $\Delta F_{adj}$ can be compared to a desired frequency threshold to determine when to halt AFC adjustments. The frequency threshold can be, for example, $|\Delta F_{adj}| \leq 100$ Hz.

The present invention advantageously provides a novel means for efficiently calibrating the selective call receiver 100 by using a plurality of reference signals which determine a sufficiently accurate model of the transfer function. The estimated transfer function allows quick calibration of the selective call receiver 100 which consequently results in improved battery life when compared to prior art systems. In addition, the self-calibrating method provides a novel method for adjustment of environment effects (e.g., temperature) as well as component effects (e.g., aging) experienced by the selective call receiver 100. Moreover, the self-calibrating method is not limited to receivers only, but can be applied to two-way radio transceivers as well.

We claim:

1. A method of calibrating a radio receiver which has a desired IF center frequency (fo) and an FM demodulator with an operating frequency range, the method comprising:
   (1) generating within the radio receiver a plurality of reference signals having frequencies within the operating frequency range of the FM demodulator;
   (2) applying the plurality of reference signals to the FM demodulator for generating demodulated reference signals;
   (3) using the demodulated reference signals to determine for the FM demodulator a transfer function that is predictive of amplitude versus frequency characteristics of signals to be demodulated by the FM demodulator;
   (4) receiving data from a transmitted signal, converting the received data to data having an intermediate frequency (IF data) and applying the IF data to the FM demodulator to generate demodulated data;
   (5) comparing a characteristic of the demodulated data to the transfer function so as to determine whether the intermediate frequency of the demodulated data differs from frequency fo; and
   (6) adjusting the intermediate frequency of the demodulated data so as to bring it closer to $f_o$.

2. A method as set forth in claim 1 wherein step (5) includes determining an average amplitude of the demodulated data, and comparing the average amplitude of the demodulated data to an amplitude predicted by the transfer function for signals at frequency $f_o$.

3. A method as set forth in claim 1 wherein the generated reference signals include a first reference signal whose frequency is substantially equal to $f_o$, a second reference signal whose frequency is higher than $f_o$ by a selected amount, and a third reference signal whose frequency is lower than $f_o$ by substantially the same selected amount.

4. A method as set forth in claim 1 wherein at least three demodulated reference signals are generated, and wherein the FM demodulator's transfer function is determined as a piece-wise linear transfer function with the three demodulated reference signals being coordinates of the piece-wise linear transfer function.

5. A method of self-calibration for a radio receiver that has a desired IF center frequency ($f_o$), and that includes an FM demodulator with an operating frequency range, the method comprising:

(1) generating within the radio receiver at least first, second and third reference signals whose frequencies are within the operating frequency range of the demodulator, the first reference signal having a frequency that is substantially equal to fo, the second reference signal having a frequency higher than fo by a selected amount, and the third reference signal having a frequency lower than fo by substantially the same selected amount;

(2) applying the reference signals to the FM demodulator for generating demodulated reference signals;

(3) using the demodulated reference signals to determine for the FM demodulator a transfer function that is predictive of amplitude versus frequency characteristics of signals to be demodulated by the FM demodulator;

(4) receiving data from a transmitted radio frequency signal, converting the received data to data at an intermediate frequency (IF data) and applying the IF data to the FM demodulator to generate demodulated data;

(5) determining an average amplitude of the demodulated data;

(6) determining any difference between the average amplitude of the demodulated data and the amplitude predicted by the transfer function for signals at frequency $f_o$; and (7) using the difference determined in step (6) to adjust the intermediate frequency of the demodulated data so as to bring it closer to frequency $f_o$.

6. A method of self-calibrating for a radio receiver which has a desired IF center frequency ($f_o$), and an FM demodulator with an operating frequency range, the method comprising:

(A) Entering a calibrate mode, and while in the calibrate mode:

(1) generating within the radio receiver a plurality of reference signals of different frequencies which are within the operating frequency range of the FM demodulator;

(2) demodulating the reference signals to generate demodulated reference signals;

(3) using the demodulated reference signals to determine for the FM demodulator a transfer function that is predictive of amplitude versus frequency characteristics of signals to be demodulated by the FM demodulator;

(B) Entering a receive mode and while in the receive mode:

(1) receiving data from a transmitted signal, converting the received data to data having an intermediate frequency (IF data) and demodulating the IF data to generate demodulated data;

(2) determining an average amplitude of the demodulated data;

(3) determining any difference between the average amplitude of the demodulated data and the amplitude predicted by the transfer function for signals at frequency $f_o$; and (4) using the difference determined in step (B)(3) to adjust the intermediate frequency of the IF data so as to bring it closer to frequency $f_o$.

7. A method as set forth in claim 6 wherein the generated reference signals include a first reference signal whose frequency is substantially equal to $f_o$, a second reference signal whose frequency is higher than $f_o$ by a selected amount, and a third reference signal whose frequency is lower than $f_o$ by substantially the same selected amount.

8. A method as set forth in claim 7 wherein the demodulator's transfer function is determined as a piece-wise linear transfer function, with the demodulated reference signals being coordinates of the linear transfer function.

9. A self-calibrating selective call receiver for receiving and processing a transmitted FM signal that includes data, the receiver comprising:

means for receiving transmitted data and for converting it to data having an intermediate frequency (IF data);

a demodulator receiving the IF data for generating demodulated data;

means within the selective call receiver for generating a plurality of reference signals of different frequencies, and for applying the reference signals to the demodulator to generate demodulated reference signals;

a system controller receiving the demodulated data and the demodulated reference signals, and programmed to determine a transfer function for the demodulator, to determine any difference between a characteristic of the demodulated data and a corresponding characteristic that the transfer function is predictive of, and to generate an error signal indicative of the magnitude of such difference; and means responsive to the error signal for adjusting the intermediate frequency.

10. A selective call receiver as set forth in claim 9, wherein said means for receiving and converting transmitted data to IF data includes a mixer receiving data derived from the transmitted FM signal plus an oscillator injection signal for generating the IF data, and wherein said means for adjusting the intermediate frequency includes an oscillator for supplying the injection signal to the mixer, the frequency of the oscillator being changed as a result of the error signal.

11. A selective call receiver as set forth in claim 9 wherein the plurality of reference signals include a first reference signal whose frequency is substantially equal to a desired intermediate frequency ($f_o$), a second reference signal whose frequency is higher than $f_o$ by a selected amount, and a third reference signal whose frequency is lower than $f_o$ by substantially the same selected amount.

12. A selective call receiver as set forth in claim 11 wherein said means for generating the reference signals includes:

means for generating an oscillator injection signal; and a programmable frequency divider receiving the oscillator injection signal and responsive to the system controller for dividing the oscillator injection signal by first, second and third divisors to generate the first, second and third reference signals.

13. A selective call receiver as set forth in claim 12, further including a mixer receiving data derived from the transmitted signal plus the oscillator injection signal for generating the IF data, whereby the mixer and the programmable frequency divider receive the same oscillator injection signal.

14. A selective call receiver as set forth in claim 9 wherein at least three demodulated reference signals are generated, and wherein the system controller determines the demodulator's transfer function as a piece-wise linear transfer function with the three demodulated reference signals being coordinates of the piece-wise linear transfer function.

15. A self-calibrating selective call receiver for receiving and processing, at a desired IF center frequency ($f_o$), a transmitted FM signal that includes data, the receiver comprising:

a mixer receiving data derived from the transmitted signal plus an oscillator injection signal for generating data having an intermediate frequency (IF data);

oscillator circuitry supplying the oscillator injection signal to the mixer;

a demodulator receiving the IF data for generating demodulated data;

a divider receiving the oscillator injection signal for converting the oscillator injection signal to at least first, second and third reference signals, the first reference signal having a frequency substantially equal to a desired intermediate frequency ($f_o$), the second reference signal having a frequency higher than $f_o$ by a selected amount, and the third reference signal having a frequency lower than $f_o$ by substantially the same selected amount; and a system controller receiving the demodulated data and being coupled to the divider, the system controller being programmed to initiate a calibrate mode wherein the system controller causes the divider to supply the three reference signals to the demodulator to generate demodulated reference signals, to use the demodulated reference signals to determine for the demodulator a transfer function that is predictive of amplitude versus frequency characteristics of signals to be demodulated by the demodulator, and wherein the system controller is programmed to determine an average amplitude for the demodulated data, to compare the average amplitude of the demodulated data to an amplitude predicted by the transfer function for signals at frequency fo, and to generate an error signal indicative of the magnitude and direction of any difference resulting from such comparison, the oscillator circuitry being responsive to the error signal for changing the frequency of its injection signal so as to adjust the intermediate frequency toward fo.

* * * * *